United States Patent
Goedicke et al.

[11] Patent Number: 6,086,963
[45] Date of Patent: Jul. 11, 2000

[54] METHOD AND DEVICE FOR CONTROL OF A VACUUM VAPORIZATION PROCESS

[75] Inventors: Klaus Goedicke; Bert Scheffel, both of Dresden; Christoph Metzner, Pappritz, all of Germany

[73] Assignee: Fraunhofer-Gesellschaft zur Forderung der Angewandten Forschung E.V., Munich, Germany

[21] Appl. No.: 09/125,106

[22] PCT Filed: Feb. 7, 1997

[86] PCT No.: PCT/DE97/00267

§ 371 Date: Sep. 2, 1998

§ 102(e) Date: Sep. 2, 1998

[87] PCT Pub. No.: WO97/30187

PCT Pub. Date: Aug. 21, 1997

[30] Foreign Application Priority Data

Feb. 14, 1996 [DE] Germany ............ 196 05 335

[51] Int. Cl.[7] .............. C23C 14/24; C23C 15/54
[52] U.S. Cl. ............ 427/585; 427/8; 118/723 VE; 118/723 EB
[58] Field of Search .............. 427/585, 8, 248.1; 204/192.1, 192.11, 192.13, 298.02, 298.03; 118/723 VE, 723 EB, 50, 51

[56] References Cited

U.S. PATENT DOCUMENTS

| | | | |
|---|---|---|---|
| 3,693,583 | 9/1972 | Vanderschueren | 118/725 |
| 4,440,803 | 4/1984 | Hordon et al. | |
| 4,683,149 | 7/1987 | Suzuki et al. | 427/255.7 |

FOREIGN PATENT DOCUMENTS

| | | |
|---|---|---|
| 0028514 | 5/1981 | European Pat. Off. . |
| 239810 | 10/1986 | German Dem. Rep. . |
| 3827920 | 1/1989 | Germany . |
| 57-169088 | 10/1982 | Japan . |
| 4-116166 | 4/1992 | Japan . |
| 4-301071 | 10/1992 | Japan . |

OTHER PUBLICATIONS

Patent Abstracts of Japan of No. 57–169088, vol. 007, No. 011 (C–145), Jan. 18, 1983.
Patent Abstracts of Japan of No. 4–116166, vol. 016, No. 362 (C–0971), Aug. 5, 1992.
Patent Abstracts of Japan of No. 4–301071, vol. 017, No. 124 (C–1035), Mar. 16, 1993.
G. Kienel, Vakuumbeschichtung Band 3—Anlagenautomatisierung, VDI–Verlag, Dusseldorf, 1994, pp. 25,26 no translation and 34–51.
Gogol et al., J. Vac. Sci. Technol. A1 (2), Apr.–Jun. 1983, pp. 252–256.
Hegner et al., Anwendung der Elektronen–Emissionsspektroskopie fur das ratengeregelte Aufdampfen von Legierungen, Vakuum–Technik, 29, 2 (1980), pp. 45–49.

*Primary Examiner*—Shrive Beck
*Assistant Examiner*—Bret Chen
*Attorney, Agent, or Firm*—Greenblum & Berstein, P.L.C.

[57] ABSTRACT

The vacuum vaporization process is controlled using recoil force of the evaporating particles as the measurable variable by measuring the rate of evaporation. The vaporizer vessel is arranged in the vacuum chamber with the aid of force transducers, and the signal emanating from the force transducers can be used to control, for example, the electrical energy to heat the vaporizing material, the beam deflection or the fill level in the vaporizer, with the sensors not coming into contact with the vapor. Vacuum vaporization processes, particularly for vapor deposition of functional coatings on tools and sheet substrates, can be controlled with this method and device.

21 Claims, 2 Drawing Sheets

METHOD AND DEVICE FOR CONTROL OF A VACUUM VAPORIZATION PROCESS

BACKGROUND OF THE INVENTION

1. Field of the Invention

The invention relates to a process for the control of a vacuum evaporation process. Pursuant to the process, functional coatings are applied above all to tools and sheet substrates, such as mirrors and glass panes, through vapor deposition.

2. Discussion of Background Information

In vapor deposition, strict requirements are set with regard to the evenness of the coating thickness, the stability of the vapor deposition rate over long periods of time and the composition of the coating material. Especially in the vaporizing of substrates with large surfaces, these requirements can only be met if the parameters of the vapor deposition process are maintained at a constant level. This presupposes that the evaporation parameters, especially the rate of evaporation, the level of the vaporizer crucible, and the direction distribution of the vapor are maintained at a constant level or are adjusted.

The material to be vaporized is in a vaporizer. This can be a vaporizer crucible, for example, in which the material—the vaporizing material—is melted. These vaporizers are arranged horizontally. Sublimation vaporizers are also used in which the vaporizing material is lodged in a holding device and evaporated from the solid phase by supplying energy, such as electron beams or resistance heating. These vaporizers may be arranged in a horizontal, vertical or diagonal manner.

It is customary to measure the rate of evaporation in one or several locations near the substrate. There are a large number of processes for determining the rate of evaporation, such as the measuring of the thickness of coatings with the help of a quartz resonator or microbalance in the vicinity of the substrate (G. Kienel: Vakuumbeschichtung Band 3—Anlagenautomatisierung, VDI-Verlag, Dusseldorf, 1994, pp. 25-, pp. 35-, pp.40-). The rate of evaporation is determined based on these processes for measuring the thickness of coatings. The rate of evaporation and therefore the evaporation process is controlled via a control circuit with the obtained signal. The substantial disadvantage of these processes consists of the set-up of the measuring instruments. The sensors must be arranged inside the vapor room and thus are subjected to such high vapor and heat so that they must be replaced after only a relatively short period of time. Thus, a frequent interruption of the evaporation process is necessary and a long-term operation is practically impossible. For this reason, these processes are suitable for low evaporation rates only. In addition, only a small part of the vapor flow is measured, from which the entire vapor flow that reaches the substrate is inferred. This is especially disadvantageous in the case of large-surface substrates, since the sensors, in an effort not to cover the substrate, are positioned at a different distance and angle to the vaporizer than the substrate and since the vapor flow density to the sensor thus has a different value than the vapor flow density to the substrate. This results in errors.

In order to avoid these errors, there are other measuring methods for controlling the process that stand in relation to the vapor flow between vaporizer and substrate. The evaluation of emitted plasma beam (DD 239 810 A1), the determination of the absorption of light or laser beams in vapor (Gogol, C. A., Reagan, S. H., J. Vac. Sci. Technol. A1 (2), April/June 1983, pp. 252–256), or the evaluation of the ionization of the vapor with the help of electron bombardment (Hegner, F.: Anwendung der Elektronen-Emissionsspektroskopie fur das ratengeregelte Aufdampfen von Legierungen, Vak. Techn. 29, 2 (1980), pp. 45–49) are all known to that end. In these processes, the sensors are not located immediately in the vapor flow but are offset to the side of the vapor flow. These processes, too, are indirect measuring processes in which substantial disadvantage exists in that, aside from the vapor density, the measurable variables depend to a great extent upon additional factors, such as the type of the vaporizing material, the stimulation and ionization of the vapor, and the vapor velocity. The set-up of the measuring instruments thus must be calibrated anew for each vaporizing material, which is quite labor intensive. Another disadvantage is that the sensors must be arranged in the vapor room and therefore are subject to a gradual coating in turn. Thereby, interruptions of the process are likewise necessary so that the sensors can be replaced, which is disadvantageous for long-term operation.

It is widely known to determine the rate of evaporation as the temporal mean by weighing the vaporizing material by interrupting the evaporation process over longer time intervals. However, this process is not suitable for industrial applications since the rate of evaporation is determined only over large time intervals and thus is not available for a continuous control of the evaporation process, or the evaporation process would have to be interrupted constantly for weighing.

Another process is known for monitoring the level of the vaporizer crucibles by means of light or laser beams. In this process, a beam is reflected on the surface of the vaporizing material and the level of the vaporizer crucible is inferred from the beam path (DE 38 27 920 A1). This process has the disadvantage that the beam path may be disturbed by possible wave movements of the surface of the vaporizing material. In addition, this process has the disadvantage that the beam—in that it must be guided through areas with the highest degree of vapor density—is subjected to a dispersion and an absorption which results in a distortion of the results of the measuring process. For this reason, this process only is conditionally suitable for controlling an evaporation process so as to meet the stringent requirements for the stability of the rate of evaporation and the exact composition of the vapor-deposited coating.

A method for vapor depositing photosensitive material (EP 0 028514 A1) is known. In this process, the vaporizer crucible is weighed in order to determine the rate of evaporation of the photosensitive material. The energy that is to be applied to the vaporizer crucible is controlled in relation to the weight change and the temperature in the vaporizer vessel.

SUMMARY OF THE INVENTION

The object of the invention is to develop a process that makes it possible to adapt a vacuum evaporation process to a pre-existing evaporation technology in that the process is monitored and its parameters controlled such that individual sheet or continuous substrates are vaporized, reactively or non-reactively, with a high coating quality, whereby even coating thicknesses with a pre-determined coating composition are obtained especially for large-surface substrates. It should be possible to place the vaporizers that evaporate the material from the solid phase in any position. The evaporation process is to be simple and reliable over long periods of time.

In one aspect the present invention is directed to a process for controlling a vacuum evaporation process in which a material is deposited on a substrate, the process comprising vaporizing the material which is positioned in at least one vaporizer in a vacuum chamber; determining a recoil force of vapor flow directed to the substrate on which the material is deposited by measuring, as a signal, a force that acts on the at least one vaporizer, the recoil force acting vertically to the surface of the vaporizing material; and supplying the signal to a control circuit as a control variable that controls at least one process parameter.

In another aspect the invention is directed to apparatus for controlling vacuum evaporation in which a material is deposited on a substrate, the apparatus comprising a vacuum chamber; at least one vaporizer positioned in the vacuum chamber for a material to be vaporized; elements associated with said at least one vaporizer capable of determining a recoil force of vapor flow directed to the substrate on which the material is deposited by measuring, as a signal, a force that acts on the at least one vaporizer, the recoil force acting vertically to the surface of the vaporizing material; and a control circuit adapted to process the signal as a control variable to control at least one process parameter.

The material is preferably heated with electron beams.

For the at least one vaporizer deviating from the vertical position in the vacuum chamber, the recoil force is determined so that a sum of weight and recoil force that act on the at least one vaporizer is measured, in that the recoil force is separated by isolated measuring from these two forces in that at least one process parameter that determines the rate of evaporation is changed so quickly that velocity of change of the recoil force is high compared to velocity of change of the weight; and in that the recoil force is determined by obtaining the difference of the sum of these forces before the change and the sum of these forces after the change of the at least one process parameter that determines the rate of evaporation.

The change of the at least one process parameter that determines the rate of evaporation can comprise briefly interrupting energy supply to the vaporizing material, reducing energy supply to the vaporizing material, or reducing power density of energy on the vaporizing material.

The at least one process parameter can comprise energy supply to the material in the at least one vaporizer, and the energy supply can be controlled with the signal so that the recoil force is kept constant.

The at least one vaporizer can include at least one refill device for material to be vaporized, the at least one process parameter can comprise a level of the material in the at least one vaporizer, and the level can be maintained constant by controlling a fill amount with the signal.

The at least one process parameter can comprise at least one of time and location of power density on the material being vaporized to control the recoil force.

The at least one vaporizer can comprise at least one large surface vaporizer, the recoil force being determined in at least two locations on the at least one large surface vaporizer, and the at least one process parameter can comprise at least one of time and location of power density on the material being vaporized to control each individual recoil force.

The at least one process parameter can comprise a flow of gas into the vacuum chamber, and the flow of gas can be controlled so that the recoil force is maintained constant.

The force that acts on the at least one vaporizer can be measured utilizing at least one force transducer.

Surprisingly, it was found that the recoil force of the vapor on the vaporizing material can be used as the measurable variable. It is well-suited for control of evaporation processes although it has not been used as a measurable variable in evaporation processes before now.

With this measurable variable, it is possible to control parameters of the evaporation process—especially the rate of evaporation, the level of a vaporizer crucible, and the direction distribution of the vapor—via a known control circuit, since the characteristics of the coatings vapor-deposited on the substrates are largely determined by these parameters.

The recoil force of the vapor on the vaporizing material arises because the vapor particles leave the surface of the vaporizing material in a direction manner and are emitted at high particle velocities. The recoil force is equal to the product of the rate of evaporation of the vaporizing material, i.e., the mass that evaporates per unit of time and the mean velocity component of the evaporated particles that is normal with regard to the vapor-emitting surface. This mean, normal velocity component in turn is the integral of the product from the direction distribution function and the mean, thermal velocity of the emitted particles across the entire solid angle area. The direction distribution of the emitted particles often corresponds to a cosine distribution with a maximum in the normal to the vapor-emitting surface but it also can be modified, especially by the effect of the recoil force onto the vapor-emitting surface of the melted vaporizing material (bath indentation) that benefits a stronger convergence of the vapor. In the case of evaporation processes with particle or beam bombardment, the recoil force is combined with the recoil force of the particles or light photons that make contact with the vaporizing material. In principal, this can be taken into consideration but is negligibly small, especially in the case of electron bombardment.

The most significant advantages of the invention are that the factor of the energy of recoil to be monitored is not distorted by other factors, such as the stimulation of the vapor; that the recoil force can easily be measured since it is a mechanical factor, that this measurable variable makes it possible to record the entire vapor flow and not just a part of it is used for characterizing the vapor flow. To this end, the vaporizer is fixed in the vacuum chamber with the help of known force transducers. All supply lines are connected such that they do not influence the measured result or such that the resulting errors can be eliminated. The force transducers functioning as sensors preferably are elastic elements with applied ductile measuring tape.

In evaporation processes with gas admission, the vapor-emitting surface of the vaporizing material is partially charged with returned vapor and possibly contaminated, especially when reactive gas is admitted. This causes a change in the rate of evaporation and consequently results in a change in the composition of the coating material. The process in accordance with the invention ensures that the substrates are vaporized evenly with a given coating composition in that the measured recoil force is set to a given control value by controlling the gas flow into the vacuum chamber. The force transducers are arranged on the side of the vaporizer that faces away from the vapor and thus are protected from the vapor flow. Thus, their function is not influenced by the evaporation process. Thus, a high degree of reliability is ensured and the process can be executed, even in long-term operation and in an operationally secure manner.

The control of an evaporation process is performed as follows. The recoil force of the vapor flow that is directed toward the substrates and that acts on the vaporizer is determined with the force transducers. The obtained signal first is amplified and then a filtering process is undertaken. This filtering process is conducted analogously with an electronic low-pass filter or through digital filters, after conversion into digital data. The filtered signal is introduced into a known control circuit that controls or guides at least one of the parameters that influence the evaporation process.

The recoil force can be determined in any installation position of the respective vaporizer. If the evaporation is carried out in horizontal direction, e.g., with sublimation vaporizers with a preferred, horizontal vapor distribution direction, the recoil force is measured in horizontal direction. The measuring of the energy of recoil can ensue continuously or at arbitrary time intervals.

In the event of the evaporation process in a vertical direction, the recoil force is measured in vertical direction. In the event of the evaporation process in diagonal direction, the recoil force is determined by measuring in horizontal as well as in vertical direction. In both cases, the recoil force also still is combined with the weight of the vaporizing material and the vaporizer vessel. Since the weight of the vaporizing material changes over the course of the evaporation, an isolation by measuring of the weight and recoil force must occur. This isolation by measuring is obtained in accordance with the invention in that the parameter determining the rate of evaporation is changed so quickly in size that the velocity of the change of the recoil force is high compared to the velocity of the change of the weight of the vaporizing material. This can occur advantageously by a brief disconnection and re-connection or a short-term reduction of the energy supply to the vaporizing material. The change in force during the on and off phase is perceived as the measure for the energy of recoil of the vapor flow.

During an evaporation process in vertical or diagonal direction, the recoil force for continuous substrates is determined in the time period in which no substrate is located above the vaporizer. With the evaporation of continuous substrates, such as steel strips or plastic foil, the recoil force is determined at the beginning and the end of the evaporation process or at even intervals of time, whereby the vaporized coating is influenced in these measuring ranges.

A number of parameters can be controlled with this process in order to regulate the evaporation process and thus to directly influence the evaporation process.

With the recoil force as a control variable, it also is possible to control the electrical energy for heating the vaporizing material with a known control circuit since this electrical energy has an immediate effect on the rate of evaporation and the mean thermal velocity of the vapor particles and thus determines the evaporation process.

Another advantageous embodiment is that, in the case of evaporation processes in which the energy supply is controlled with location and/or time, such as in the case of electron beam evaporation with beam deflection, the signal obtained from the recoil force can be used to influence these deflection parameters and/or the beam focusing in the customary manner.

If the direction distribution and the mean thermal velocity of the vapor particles are known or if their values remain almost constant during the evaporation process, it is possible to control the evaporation process with the help of the signal obtained from the recoil force so that the rate of evaporation can be kept constant over a long period of time or can be changed in a targeted manner in accordance with the evaporation task.

Another advantageous embodiment of the process for the control of evaporation processes is that, in the case of vaporizer crucibles with continuously-working refill devices for the vaporizing material, it is possible to control the supply via the signal that is obtained from the recoil force of recoil and that is proportional to the rate of evaporation in a manner that ensures that the quantity of the vaporizing material or the level in the vaporizer crucible remains constant. Thus a long-term stability of the rate of evaporation is attained since it, too, is dependent upon the level.

In the case of vaporizer crucibles without refill devices, with the signal obtained from the recoil force, it is possible to determine the quantity of the consumed vaporizing material or the current level of the vaporizer crucible. The parameters that are obtained in this manner in turn are used to control the evaporation process in that, on one hand, the beam focusing and/or the deflection parameters are controlled, in order to avoid a change in the rate of evaporation, for example. On the other hand, the time and the quantity for refilling the vaporizing material are determined.

In addition, it is possible keep the direction distribution of the vapor constant if the mean thermal velocity of the vapor particles is known and the rate of evaporation was determined experimentally. In this case, the recoil force is a measure for the direction distribution of the emitted vapor particles. The electric power for heating the vaporizing material or the distribution of the power density on the surface of the vaporizing material is controlled such that the recoil force assumes a certain value. In evaporation processes in which the energy supply is controlled in location and time and, as is the case in electron beam evaporation with beam deflection, for example, it also is possible to determine the location of the evaporation zone on the vaporizing material. The recoil force is determined at two different points of the vaporizer, preferably on the narrow sides in the case of extended vaporizers. If the evaporation takes place starting from a zone in the center between the force transducers, the energy of recoil is transmitted evenly to both force transducers. If the evaporation is off-center, the energy of recoil is transmitted unevenly to the force transducers. In accordance with the invention, the location of the evaporation zone is inferred from the evaluation of both signals of the recoil force. The location of the evaporation zone then is corrected with the help of a customary control circuit. This process variation also is suitable if several evaporation zones are heated on the vaporizing material. To this end, the recoil force that emanates from all evaporation zones is determined first. Then, the recoil force that emanates from an individual evaporation zone is determined in that the energy supply to this respective evaporation zone only is interrupted briefly while the energy supply to all other evaporation zones remains unchanged. The evaluation of the change in the recoil force on the force transducers is carried out as described above. The signal that is obtained is used in a control circuit in order to control the rate of evaporation that emanates from this evaporation zone and bring it to a certain control value.

Already-existing devices can be retrofitted without great difficulty or expense, in that the vaporizers no longer are directly connected to the vacuum chamber but instead force transducers are arranged between vaporizer and vacuum chamber. In addition, a customary control circuit is required that, in its most simple form, is comprised of a filter and a controller that processes the signal and triggers the corresponding parameters for controlling the evaporation process.

BRIEF DESCRIPTION OF DRAWINGS

The invention is explained in more detail with the help of an exemplary embodiment. The appurtenant drawings, shown are.

DETAILED DESCRIPTION OF THE INVENTION

Figure 1:
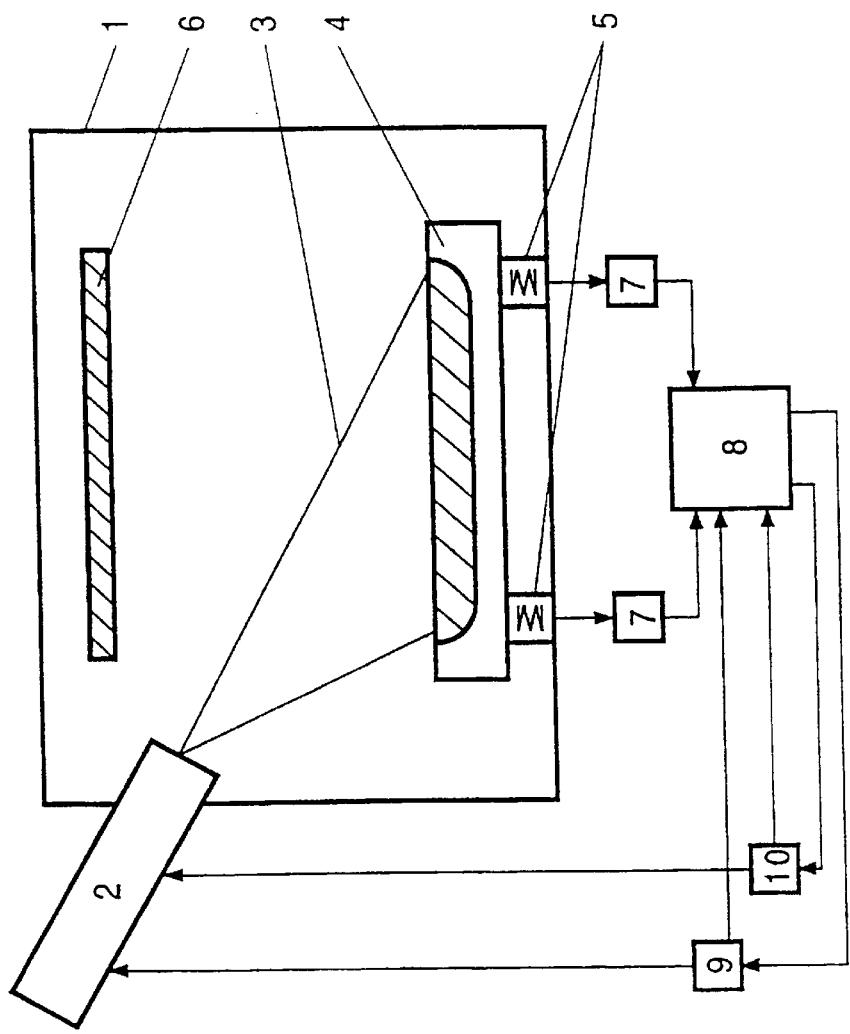
FIG. 1 illustrates a cross-section through a device for the execution of the process with an electron-gun and a vaporizer crucible arranged in horizontal position.
Figure 2:
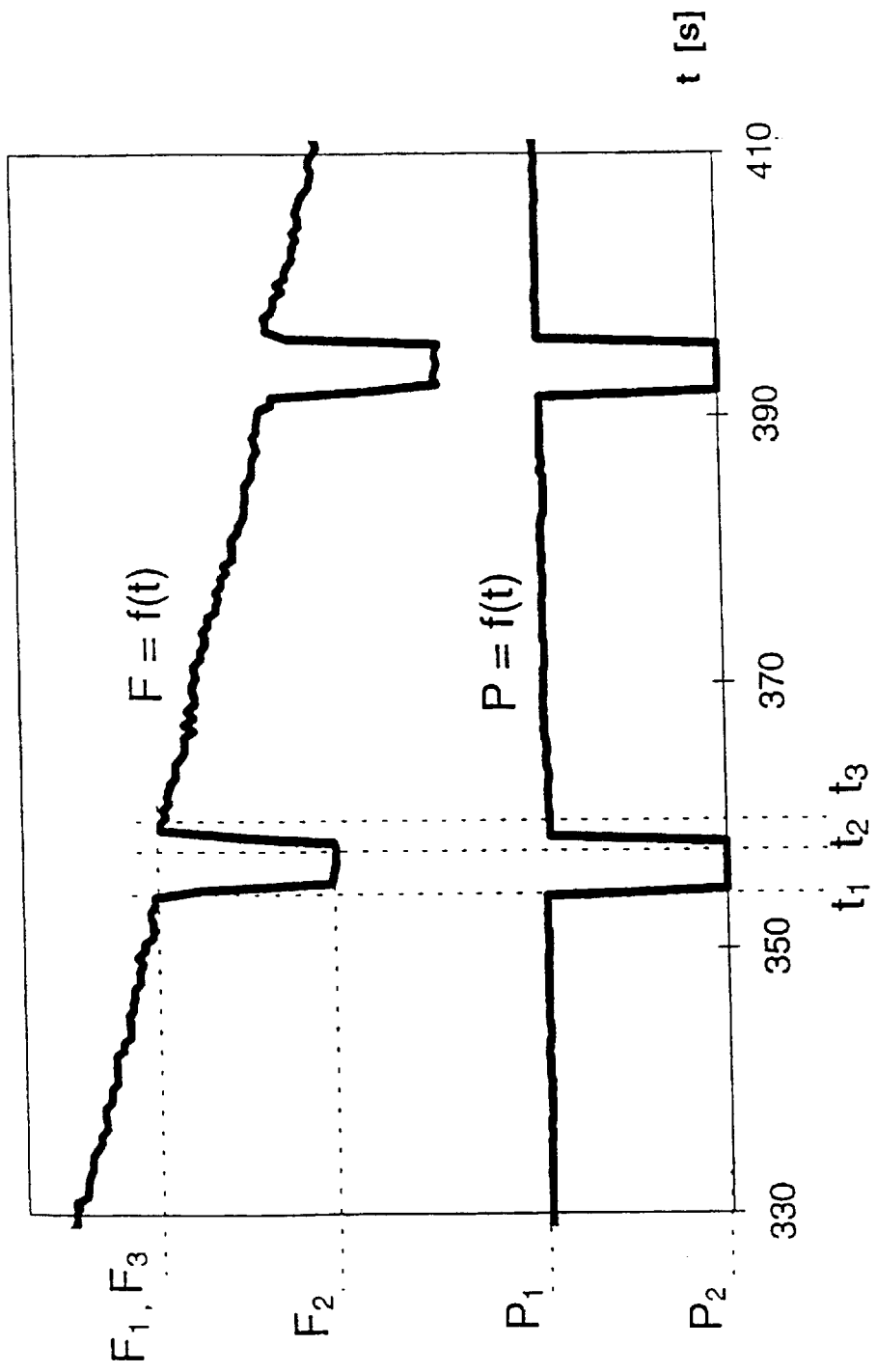
FIG. 2 illustrates a diagram of the force and electrical power as a function of time for the electron beam evaporation process.

In FIG. 1 an axial type electron-gun 2, the electron beam 3 of which charges a vaporizer crucible 4 filled with titanium as programmed, is arranged on one side of a vacuum chamber 1. The vaporizer crucible 4 is arranged in the vacuum chamber 1 by means of force transducers 5, preferably elastic elements with applied ductile measuring tape. A substrate 6 that is to be coated is arranged above vaporizer crucible 4. The filters 7 that succeed force transducers 5 process the signals of the forces measured with the transducers 5. The output signals of filters 7 are supplied to a controller 8. This only evaluates the signals in terms of gate times provided by the signals of a power output device 9 and a deflection control 10, namely in terms of the gate times before or after an abrupt change of the electron beam energy. FIG. 2 shows at what times the signals of the force transducers 5 are supplied to controller 8. Electron beam power P and force F as sum of the signals of the force transducers 5 are shown as a function of time t. First, the evaporation takes place with electron beam power $P_1$. Force $F_1$ is measured at time $t_1$ and is comprised of the recoil force of the evaporating titanium and the weight of the molten titanium and vaporizer crucible 4. Then electron beam power P is switched from $P_1$ to $P_2=0$ without delay. At time $t_2$ ($t_2>t_1$), when no more titanium is evaporating, force $F_2$ is measured. The force $F_2$ corresponds to the weight. Then electron beam power P is switched back to $P_1$ without delay. Force $F_3$ is measured at time $t_3$ ($t_3>t_2$). This force $F_3$ again is composed of the recoil force of the titanium that is evaporating and the weight of the molten titanium and the vaporizer vessel 4.

The recoil force is determined in controller 8 by the difference between forces $F_1$ and $F_2$ that were measured at times $t_1$ and $t_2$. The controller 8 compares the recoil force determined with the control values. The recoil force based on the difference between forces $F_3$ and $F_2$ that were measured at times $t_3$ and $t_2$ was determined for verification purposes. With a deviation of the recoil force from the control value, the control value for power output device 9 and/or deflection control 10 for electron-gun 2 is modified such that the deviation of the recoil force from the control value is reduced to a minimum.

Deviating from this exemplary embodiment, the force transducers measure the forces in horizontal and vertical direction with a diagonal arrangement of the vaporizer. The force that is measured in horizontal direction is a component of the resulting recoil force. In the case of the forces measured in vertical direction, the component of the recoil force that acts vertically is determined as is described in the exemplary embodiment. Then the resulting recoil force, which is used for control purposes as described above, is determined in controller 8.

With a vertical arrangement of the vaporizer, the recoil force acts in horizontal direction. No other force is superimposed to this recoil force. Thus no isolation of the forces by measuring is necessary. The recoil force is measured continuously and is used for control purposes as described above.

What is claimed:

1. A process for controlling a vacuum evaporation process in which a material is deposited on a substrate, said process comprising:

vaporizing the material which is positioned in at least one vaporizer in a vacuum chamber;

determining a recoil force of vapor flow directed to the substrate on which the material is deposited by measuring, as a signal, a force that acts on the at least one vaporizer, the recoil force acting vertically to the surface of the vaporizing material; and supplying the signal to a control circuit as a control variable that controls at least one process parameter.

2. The process according to claim 1, wherein the material is heated with electron beams.

3. The process according to claim 1, wherein when the at least one vaporizer deviates from a vertical position in the vacuum chamber, the recoil force is determined so that a sum of weight of the material positioned in the at least one vaporizer and the at least one vaporizer and recoil force that act on the at least one vaporizer is measured, in that the recoil force is separated by isolated measuring from the weight and recoil forces in that at least one process parameter that determines the rate of evaporation is changed so quickly that velocity of change of the recoil force is higher than velocity of change of the weight; and in that the recoil force is determined by obtaining the difference of the sum of these forces before the change and the sum of these forces after the change of the at least one process parameter that determines the rate of evaporation.

4. The process according to claim 3, wherein the change of the at least one process parameter that determines the rate of evaporation comprises briefly interrupting energy supply to the vaporizing material.

5. The process according to claim 4, wherein the material is heated with electron beams.

6. The process according to claim 3, wherein the change of the at least one process parameter that determines the rate of evaporation comprises reducing energy supply to the vaporizing material.

7. The process according to claim 6, wherein the material is heated with electron beams.

8. The process according to claim 3, wherein the change of the at least one process parameter that determines the rate of evaporation comprises reducing power density of energy on the vaporizing material.

9. The process according to claim 8, wherein the material is heated with electron beams.

10. The process according to claim 1, wherein the at least one process parameter comprises energy supply to the material in the at least one vaporizer, and the energy supply is controlled with the signal so that the recoil force is kept constant.

11. The process according to claim 10, wherein the material is heated with electron beams.

12. The process according to claim 1, wherein the at least one vaporizer includes at least one refill device for material to be vaporized, the at least one process parameter comprises a level of the material in the at least one vaporizer, and the level is maintained constant by controlling a fill amount with the signal.

13. The process according to claim 12, wherein the material is heated with electron beams.

14. The process according to claim 1, wherein the at least one process parameter comprises at least one of time and location of power density on the material being vaporized to control the recoil force.

15. The process according to claim 14, wherein the material is heated with electron beams.

16. The process according to claim 1, wherein the at least one vaporizer comprises at least one vaporizer, the recoil force is determined in at least two locations on the at least one vaporizer, and the at least one process parameter comprises at least of one time and location of power density on the material being vaporized to control each individual recoil force.

17. The process according to claim 1, wherein the at least one process parameter comprises a flow of gas into the vacuum chamber, and the flow of gas is controlled so that the recoil force is maintained constant.

18. The process according to claim 1, wherein the force that acts on the at least one vaporizer is measured utilizing at least one force transducer.

19. Apparatus for controlling vacuum evaporation in which a material is deposited on a substrate, said apparatus comprising:

a vacuum chamber;

at least one vaporizer positioned in said vacuum chamber for a material to be vaporized;

elements associated with said at least one vaporizer capable of determining a recoil force of vapor flow directed to the substrate on which the material is deposited by measuring, as a signal, a force that acts on the at least one vaporizer, the recoil force acting vertically to the surface of the vaporizing material; and a control circuit adapted to process the signal as a control variable to control at least one process parameter.

20. The apparatus according to claim 19, wherein said elements include at least one force transducer.

21. The apparatus according to claim 19, including an electron beam generator for heating the material.

* * * * *